United States Patent
Matschitsch et al.

[11] Patent Number: 6,147,403
[45] Date of Patent: Nov. 14, 2000

[54] SEMICONDUCTOR BODY WITH METALLIZING ON THE BACK SIDE

[75] Inventors: Martin Matschitsch, Feistritz I. Ros., Austria; Thomas Laska, München, Germany; Herbert Mascher, Kötschach, Austria; Andreas Mätzler, Bodensorf, Austria; Werner Stefaner, Villach, Austria; Gernot Moik, Sattendorf, Austria

[73] Assignee: Infineon Technologies AG, Munich, Germany

[21] Appl. No.: 09/285,902

[22] Filed: Apr. 8, 1999

Related U.S. Application Data

[63] Continuation of application No. PCT/DE98/02199, Jul. 31, 1998.

[30] Foreign Application Priority Data

Aug. 8, 1997 [DE] Germany ............... 197 34 434

[51] Int. Cl.[7] ........................ H01L 23/48; H01L 23/52; H01L 29/40
[52] U.S. Cl. .................... 257/751; 257/750; 257/758; 257/764; 257/765; 257/766; 257/771; 257/776
[58] Field of Search ................. 257/751, 750, 257/758, 764, 765, 766; 253/753, 771, 772

[56] References Cited

U.S. PATENT DOCUMENTS

| | | | |
|---|---|---|---|
| 4,408,216 | 10/1983 | Gould | 257/751 |
| 4,753,851 | 6/1988 | Roberts et al. | 428/627 |
| 4,875,088 | 10/1989 | Egawa et al. | |
| 5,182,420 | 1/1993 | Steitz et al. | 174/52.4 |
| 5,249,728 | 10/1993 | Lam | 228/111 |
| 5,635,763 | 6/1997 | Inoue et al. | 257/763 |
| 5,976,969 | 11/1999 | Lin et al. | 438/629 |

FOREIGN PATENT DOCUMENTS

| | | |
|---|---|---|
| 0 720 231 A2 | 7/1996 | European Pat. Off. |
| 38 23 347 A1 | 1/1990 | Germany |
| 92 12 486 | 4/1993 | Germany |
| 196 03 654 C1 | 7/1997 | Germany |

OTHER PUBLICATIONS

"High Reliability Microwave Silicon Power Transistor With Stepped Electrode Structure and TiN Diffusion Barrier" (Kanamori et al.), IEEE Transactions on Electron Devices, vol. ED–33, No. 3, Mar. 1986, pp. 402–408.

*Primary Examiner*—David Hardy
*Assistant Examiner*—Jhihan B Clark
*Attorney, Agent, or Firm*—Herbert L. Lerner; Laurence A. Greenberg; Werner H. Stemer

[57] ABSTRACT

To markedly reduce wafer warping of semiconductor wafers without weakening the strength of adhesion to substrate materials, a novel back side metallizing system is presented. On a silicon semiconductor body an aluminum layer and a diffusion barrier layer that includes titanium are provided. A titanium nitride layer is incorporated into the titanium layer because it has been demonstrated that the titanium nitride layer can compensate for a large proportion of the wafer warping that occurs. Preferably, the usual tempering for improving the ohmic contact between the aluminum layer and the silicon semiconductor body is not performed after the complete metallizing of the semiconductor body, but rather after a first, thin aluminum layer has been deposited onto the silicon semiconductor body.

10 Claims, 1 Drawing Sheet

SEMICONDUCTOR BODY WITH METALLIZING ON THE BACK SIDE

CROSS-REFERENCE TO RELATED APPLICATION

This is a continuation of copending International Application PCT/DE98/02199, filed Jul. 31, 1998, which designated the United States.

BACKGROUND OF THE INVENTION

Field of the Invention

The invention relates to a silicon semiconductor body, which can be soldered to a metal substrate plate via a succession of metal layers, and which before the soldering, in order from the silicon to the substrate plate, has an aluminum layer and a diffusion barrier layer.

Such semiconductor bodies are incorporated into semiconductor elements, especially power semiconductor elements, which are on the market in great numbers. The sequence of metal layers as a rule includes an aluminum layer, which is seated on a silicon semiconductor body. The aluminum layer adheres well to the silicon and form a perfect ohmic contact, especially with p-doped silicon. In the prior art, a diffusion barrier layer, which is usually of titanium or chromium, is seated on the aluminum layer and acts as an adhesion promoter and back side barrier between a further metal layer, as a rule a nickel layer, seated on the diffusion barrier layer, and the aluminum layer.

Because the coefficients of thermal expansion are different for the individual metal layers on the one hand and for the silicon semiconductor body on the other, severe mechanical stresses are engendered. Especially in thin semiconductor bodies, that is, semiconductor bodies that have a thickness of 250 $\mu$m or less, severe warping of the wafer occurs, that is, warping greater than 1000 $\mu$m.

This makes handling of the wafers more difficult; increased cassette positioning mistakes occur, and there is an increased danger of breakage. Until now, the attempt was made to solve the problem by minimizing the nickel layer thickness as much as possible, so that the soldering still had adequate adhesion strength. Despite reduced nickel layer thicknesses, that is, layer thicknesses of approximately 1 $\mu$m, nevertheless in production wafer warping of 700 to 2000 $\mu$m still occurs and leads to the above problems.

Particularly with a view to the desire for ever-thinner semiconductor bodies, that is, semiconductor bodies that have a thickness of approximately 100 $\mu$m, there is a need for a metallizing process that helps solve the above problems. Such semiconductor bodies are needed particularly in power field effect transistors and IGBTs of the vertical type.

Published, Non-prosecuted German Patent Application DE 38 23 347 A1 describes a semiconductor element having a high current carrying capacity and a contact layer construction of the semiconductor body. The metallizing includes a first layer of aluminum, a second layer of chromium or titanium as an adhesion layer and as a diffusion barrier for the aluminum, a solderable third layer of nickel, and a concluding protective layer of gold or palladium, or of a solderable layer each with a partial layer of nickel and copper. The copper at the same time is the outermost layer or can also be covered with gold or palladium.

In IEEE Transactions on Electron Devices, 1986, Vol. ED-33, No. 3, pages 402–408, a silicon power transistor with a stepped electrode structure and a titanium nitride diffusion barrier is described. The titanium nitride diffusion barrier layer is applied, in the form of a succession of titanium, titanium nitride, and titanium, between a gold electrode terminal and a silicon substrate. As a result, high reliability and a long service life of the bond are attained, and a gold-silicon reaction is prevented.

SUMMARY OF THE INVENTION

It is accordingly an object of the invention to provide a semiconductor body with a metallizing on the back side that overcomes the above-mentioned disadvantages of the prior art devices of this general type, in which wafer warping is markedly reduced without losses of adhesion strength to the substrate materials.

With the foregoing and other objects in view there is provided, in accordance with the invention, a layered semiconductor configuration to be soldered to a metal substrate plate, including: a silicon semiconductor body; an aluminum layer disposed on the silicon semiconductor body; a titanium layer disposed on the aluminum layer; and a titanium nitride layer disposed in the titanium layer and acting as a diffusion barrier layer.

The object is attained in that a titanium layer into which a titanium nitride layer is incorporated is provided as the diffusion barrier layer.

Surprisingly, it has been found that by incorporating a titanium nitride layer into the titanium layer acting as a diffusion barrier layer, a majority of the incident wafer warping can be compensated for.

Typically, onto the thus-processed diffusion barrier layer, a nickel layer is then applied, onto which, either with the deposition of an adhesion promoter layer or without an adhesion promoter layer, an oxidation protection layer, preferably a silver layer, is applied.

In an alternative version of the present invention, a solder material layer, which preferably includes tin or lead or gallium, is deposited onto the titanium layer. By this procedure, the semiconductor body can be soldered directly to the substrate plate by heating to temperatures above approximately 250°, without having to solder a separate solder material layer to an nickel layer. It is then unnecessary to add other soldering agents and fluxes.

The solder layers thus created are virtually stress-free, so that only marginal substrate warping occurs.

The semiconductor body of silicon in accordance with the present invention is typically produced by the following method. The method of the invention includes the following steps:

a) an aluminum layer is deposited onto the semiconductor body;

b) a first titanium layer is deposited onto the aluminum layer;

c) a titanium nitride layer is deposited onto the titanium layer;

d) a second titanium layer is deposited on to the titanium nitride layer.

Especially good back-side metallizing is attained by first applying a thin aluminum layer to the semiconductor body and then tempering the thus-processed semiconductor body, preferably at approximately 350° C. Once the tempering has been done, a further aluminum layer is deposited onto the first aluminum layer.

Because of the two parts of the aluminum coating process and the in-situ tempering of the aluminum-coated semiconductor body, the effect of the incorporated titanium nitride layer in the titanium layer is especially well stabilized. It has in fact been found that by shifting the tempering step from the end of the metallizing process to the aluminum coating process, the favorable properties of the titanium nitride layer are largely preserved.

If the tempering step were done at the end of the metallizing, then the favorable property of the titanium nitride layer would be negatively affected; that is, in the worst case, approximately 50% of the stress-compensating properties of the titanium nitride layer would be lost.

Shifting the tempering step from the end of metallizing to the aluminum coating process causes no impairment of the overall metallizing process, since the tempering step serves merely to establish an especially good contact between aluminum and silicon.

Typically, all the metal layers in the method of the invention are vapor-deposited.

After method step d) has been performed, it is possible, depending on which procedure is desired, to deposit a nickel layer onto the titanium layer, with an ensuing deposition of an oxidation protection layer. Between the deposition of the oxidation protection layer and the nickel layer, the deposition of an adhesion promoter layer can optionally be done, and this layer again can include titanium.

In an alternative embodiment, however, the application of a solder material layer of tin, lead or gallium is done directly after method step d).

Typically, all the metal layers are vapor-deposited.

Other features which are considered as characteristic for the invention are set forth in the appended claims.

Although the invention is illustrated and described herein as embodied in a semiconductor body with a metallizing on the back side, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
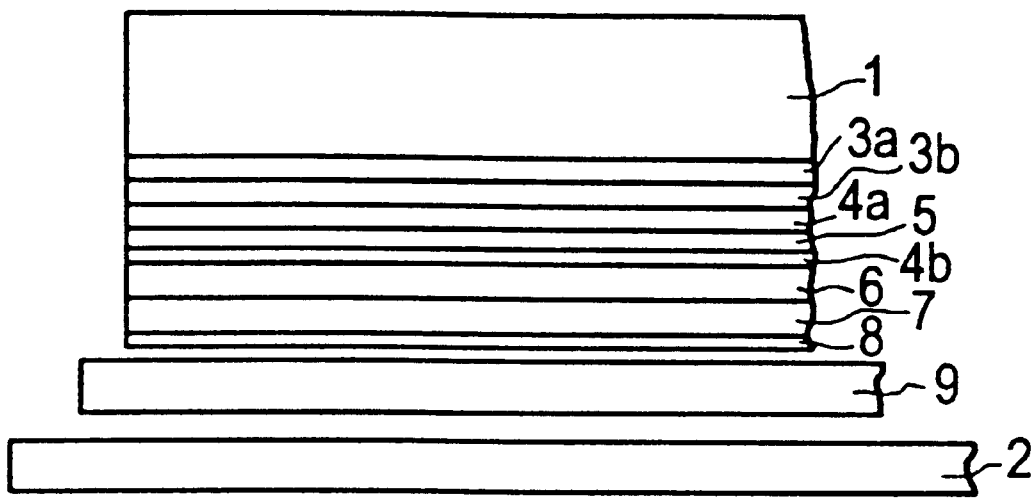
FIG. 1 is a sectional view through a metallic layer sequence according to the invention.

In all the figures of the drawing, sub-features and integral parts that correspond to one another bear the same reference symbol in each case. Referring now to the figures of the drawing in detail and first, particularly, to FIG. 1 thereof, there is shown a layer sequence of metals before a finishing soldering step is performed. The sequence of metal layers includes an aluminum layer 3a, 3b, which is vapor-deposited onto a silicon semiconductor body 1. The aluminum layer 3a, 3b adheres well to the silicon semiconductor body 1 and particularly with P-doped silicon forms a perfect ohmic contact. The aluminum layer 3a, 3b includes a first aluminum layer 3a, approximately 30 nm thick and a second aluminum layer 3b approximately 70 nm thick. Between the deposition of the first aluminum layer 3a and the deposition of the second aluminum layer 3b, the coated silicon semiconductor body 1 was tempered at a temperature of approximately 350 C for between 10 minutes and 90 minutes. By the in-situ tempering of the silicon semiconductor body 1, especially good adhesion of the first aluminum layer 3a to the silicon is achieved.

A titanium layer 4a, 4b is seated on the aluminum layer 3b and serves as an adhesion promoter and diffusion barrier between a nickel layer 6, seated on the titanium layer 4a, 4b, and the aluminum layer 3a, 3b.

The titanium layer 4a, 4b includes a first titanium layer 4a, approximately 30 nm thick, and a second titanium layer 4b, again approximately 30 nm thick. A titanium nitride layer 5 approximately 40 nm thick is seated between the first titanium layer 4a and the second titanium layer 4b. The titanium nitride layer 5 compensates for a majority of the wafer warping that occurs as a consequence of the different coefficients of thermal expansion.

The nickel layer 6 that has a thickness of approximately 1000 nm is applied to the second titanium layer 4b. The nickel layer 6, in the exemplary embodiment shown here, serves the purpose of soldering to a metal substrate plate 2, which is preferably of copper. Onto the nickel layer 6, an adhesion promoter layer 7 of titanium is again applied, in this case with a thickness of approximately 4 nm. The adhesion promoter layer 7 may, however, also include other materials, in particular chromium. Onto the adhesion promoter layer 7, an oxidation protection layer 8 of a noble metal is then applied; in the exemplary embodiment shown, the oxidation protection layer 8 is of silver. However, the use of palladium, gold or other noble metals is also conceivable. The adhesion promoter layer 7 acts to counter detachment of the silver layer, shown, from the nickel layer 6. In the soldering operation, a solder material 9 is then placed between the oxidation protection layer 8 and the metal substrate plate 2, so that a metallurgical bond is created between the nickel and the copper in the soldering operation.

Figure 2:
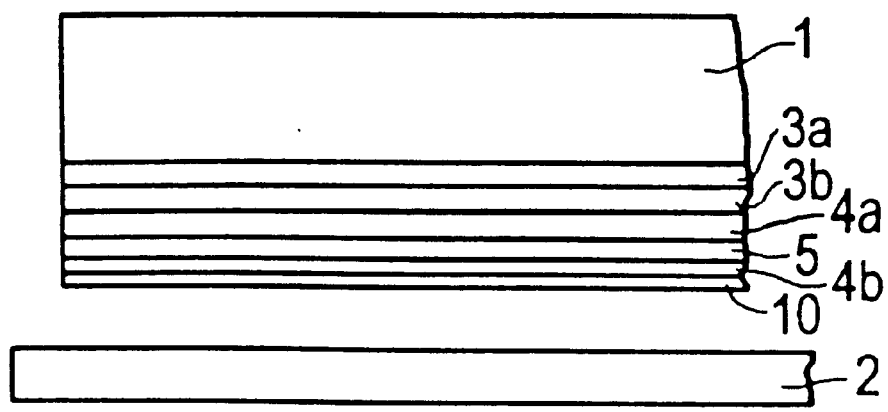
FIG. 2 is a sectional view through a second embodiment of the metallic layer sequence.

In FIG. 2, a different metallizing system is shown, but the special features of the aluminum layer 3a, 3b and the titanium layer 4a, 4b correspond to the special features in FIG. 1. A discussion of the aluminum layer 3a, 3b and the titanium layer 4a, 4b, and in particular of the in-situ tempering of the first aluminum layer 3a and the incorporation and action of the titanium nitride layer 5 will be dispensed with here. Reference is made to the above portions of the specification.

In contrast to the metallizing of FIG. 1, here it is not a nickel layer that has been deposited onto the titanium layer 4b but rather a solder material layer 10 of tin has been applied directly. The tin layer shown here can have a thickness of from 1000 to 3000 nm. A thickness of approximately 2700 nm has proved especially expedient.

The thus-metallized silicon semiconductor body 1 is then pressed onto the metal substrate plate 2, which as a rule is of copper, and is bonded to it at approximately 300 C in a protective gas atmosphere or under vacuum conditions. A metallurgical bond is created between the second titanium layer 4b, the solder material layer 10, and the substrate plate 2, and the bond is stable up to a temperature of approximately 450 C.

Technologically, through the method and the metallizing of the invention, it becomes possible to further reduce the thickness of silicon semiconductor substrates, and in particular the thickness of silicon semiconductor substrates intended for power transistors and IGBTs of the vertical type, which leads to an improvement in the conducting-state property in these components.

We claim:

1. A layered semiconductor configuration to be soldered to a metal substrate plate, comprising:

a silicon semiconductor body;

an aluminum layer disposed on said silicon semiconductor body, said aluminum layer being at least partially tempered before any further layering;

a titanium layer disposed on said aluminum layer; and a titanium nitride layer disposed in said titanium layer and acting as a diffusion barrier layer.

2. The semiconductor configuration according to claim 1, including a nickel layer disposed on said titanium layer.

3. The semiconductor configuration according to claim 1, including a solder material layer disposed on said titanium layer.

4. The semiconductor configuration according to claim 2, including an oxidation protection layer disposed on said nickel layer.

5. The semiconductor configuration according to claim 4, including an adhesion promoter layer disposed between said nickel layer and said oxidation protection layer.

6. The semiconductor configuration according to claim 3, wherein said solder material layer is selected from the group consisting of a tin layer, a lead layer and a gallium layer.

7. A layered semiconductor configuration to be soldered to a metal substrate plate, comprising:

a silicon semiconductor body;

an aluminum layer disposed on said silicon semiconductor body;

a titanium layer disposed on said aluminum layer; and a titanium nitride layer disposed in said titanium layer and acting as a diffusion barrier layer;

a nickel layer disposed on said titanium layer;

an oxidation protection layer disposed on said nickel layer.

8. The semiconductor configuration according to claim 7, including an adhesion promoter layer disposed between said nickel layer and said oxidation protection layer.

9. A layered semiconductor configuration to be soldered to a metal substrate plate, comprising:

a silicon semiconductor body;

an aluminum layer disposed on said silicon semiconductor body;

a titanium layer disposed on said aluminum layer; and a titanium nitride layer disposed in said titanium layer and acting as a diffusion barrier layer;

a solder material layer disposed on said titanium layer.

10. The semiconductor configuration according to claim 9, wherein said solder material layer is selected from the group consisting of a tin layer, a lead layer and a gallium layer.

* * * * *